United States Patent
Gollnick et al.

(10) Patent No.: US 10,687,449 B2
(45) Date of Patent: Jun. 16, 2020

(54) COMPONENT DELIVERY DEVICE

(71) Applicant: Mechanical Turnkey Solutions, Inc., Detroit, MI (US)

(72) Inventors: Wayne Gollnick, Sterling Heights, MI (US); Robert E. Obrecht, Detroit, MI (US)

(73) Assignee: MECHANICAL TURNKEY SOLUTIONS, INC., Detroit, MI (US)

( * ) Notice: Subject to any disclaimer, the term of this patent is extended or adjusted under 35 U.S.C. 154(b) by 0 days.

(21) Appl. No.: 16/144,260

(22) Filed: Sep. 27, 2018

(65) Prior Publication Data

US 2020/0107480 A1   Apr. 2, 2020

(51) Int. Cl.
*H05K 13/04* (2006.01)
*H05K 13/08* (2006.01)

(52) U.S. Cl.
CPC ..... *H05K 13/0406* (2018.08); *H05K 13/0408* (2013.01); *H05K 13/0413* (2013.01); *H05K 13/0882* (2018.08)

(58) Field of Classification Search
CPC ........... H05K 13/0406; H05K 13/0408; H05K 13/0413; H05K 13/0882; B25J 15/0047; B66C 1/54

USPC .................................................. 294/94, 183
See application file for complete search history.

(56) References Cited

U.S. PATENT DOCUMENTS

| | | | |
|---|---|---|---|
| 3,773,189 A * | 11/1973 | Kitamura | B25J 9/144 414/753.1 |
| 6,367,856 B1 | 4/2002 | Jasperse | |
| 6,659,523 B2 | 12/2003 | Jasperse | |
| 9,662,754 B2 * | 5/2017 | Beaty | B23P 19/005 |

* cited by examiner

*Primary Examiner* — Ronald P Jarrett
(74) *Attorney, Agent, or Firm* — Brooks Kushman P.C.

(57) ABSTRACT

A component delivery device includes an actuator that displaces an outer sleeve and an inner rod positioned within a cavity of the outer sleeve together from a retracted configuration to an extended configuration to move an ejectable component in relation to a feed head. The actuator further displaces the outer sleeve and not the inner rod to an ejection configuration to displace the ejectable component toward a workpiece. Displacing the outer sleeve and not the inner rod causes the outer sleeve to translate over the inner rod and compresses a biasing member that is disposed within the cavity and in engagement with the inner rod.

20 Claims, 6 Drawing Sheets

(EXTENDED CONFIGURATION)

(EXTENDED CONFIGURATION)

(EXTENDED CONFIGURATION)

(RETRACTED CONFIGURATION)

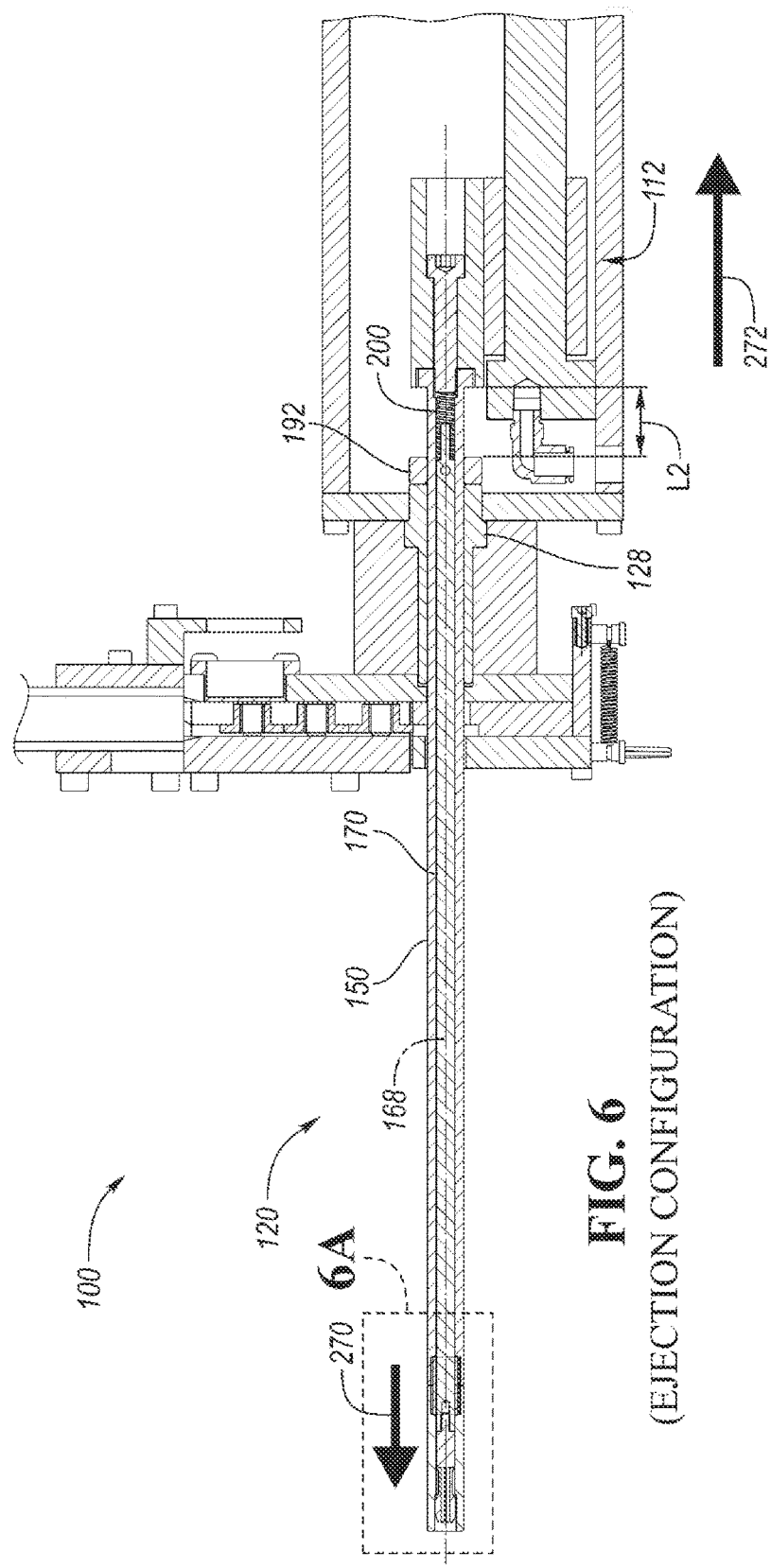
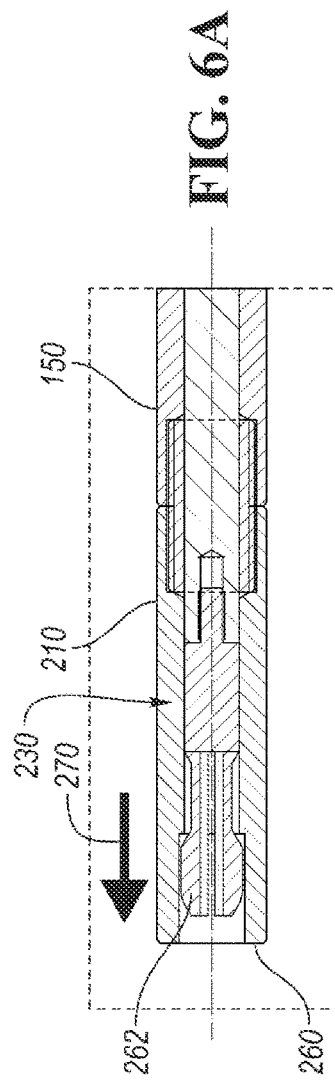
FIG. 6
(EJECTION CONFIGURATION)
FIG. 6A

COMPONENT DELIVERY DEVICE

TECHNICAL FIELD

This disclosure relates to a delivery device, and more particularly, to a delivery device adapted to deliver and eject a component.

BACKGROUND

In many approaches, automated production line assemblies may utilize a transfer apparatus to hold or grasp an article needed for the assembly of a product. For example, transfer apparatuses may be used in the automated transportation of bolts, studs, or nuts. The transfer apparatus may move or transport the article, component, or subassembly (collectively, "component") from a first location to a second location. Once the article is transported to the second location, the transfer apparatus may release the article and may retract. This process may be repeated.

SUMMARY

In at least one approach, a method of operating a component delivery device is provided. The method may include displacing, with an actuator, an outer sleeve and an inner rod positioned within a cavity of the outer sleeve together from a retracted configuration toward an extended configuration to move an ejectable component in relation to a feed head. The method may further include displacing, with the actuator, the outer sleeve and not the inner rod toward an ejection configuration to displace the ejectable component toward a workpiece. Displacing the outer sleeve and not the inner rod may cause the outer sleeve to translate over the inner rod and may compress a biasing member that is disposed at least partially within the cavity and in engagement with the inner rod.

The method may further include securing a removable tip to an outboard end of the inner rod. The removable tip may include a support surface for receiving the ejectable component. The method may further include securing a removable sleeve extension to an outboard end of the outer sleeve. In the retracted configuration, at least a portion of the removable tip extends longitudinally beyond an outboard end of the removable sleeve extension to receive the ejectable component. In the ejection configuration, the removable sleeve extension is displaced over the portion of the removable tip to eject the ejectable component.

In at least one approach, a component delivery device is provided. The component delivery device may include a rod assembly that may include an outer sleeve and an inner rod extending at least partially within the outer sleeve. The component delivery device may further include a biasing member positioned at least partially within the outer sleeve. The biasing member may be configured to effect a biasing force on an inboard portion of the inner rod. The biasing member may have a first axial length (L1) when the rod assembly is in a retracted configuration. The component delivery device may further include an actuator configured to displace the outer sleeve and the inner rod together from the retracted configuration to an extended configuration to move an ejectable component with the rod assembly. The actuator may further be configured to displace the outer sleeve from the extended configuration to an ejection configuration to eject the ejectable component from the rod assembly. In the ejection configuration, the outer sleeve may be axially displaced relative to the inner rod and the biasing member may be compressed to a second axial length (L1) that is less than the first axial length (L2).

The outer sleeve may include a guide slot that may extend longitudinally along the outer sleeve. The inner rod may include a pin guide that may be disposed in alignment with at least a portion of the guide slot. A pin stop that includes a pin may be provided. The pin may extend through the guide slot and the pin guide such that the pin is movably fixed to the inner rod and is displaceable within the guide slot. The pin stop may further include an annular stop that extends about an outer circumference of the outer sleeve. The annular stop may be movably fixed to the inner rod and displaceable relative to the outer sleeve.

The component delivery device may further include a rod stop. The rod stop may include an abutment surface, and may define an aperture for receiving the outer sleeve and the inner rod. In the retracted configuration, the annular stop is spaced apart from the rod stop and the pin is disposed at a first longitudinal location along the guide slot. In the extended configuration, the annular stop is engaged with the rod stop. In the ejection configuration, the pin is disposed at a second longitudinal location along the guide slot longitudinally offset from the first longitudinal location.

The component delivery device may further include an adapter block. The adapter block may be secured to a slidable member of the actuator and to an inboard portion of the outer sleeve. A threaded fastener may extend through a through-hole of the adapter block and into a threaded receptacle at an inboard portion of the outer sleeve. In this way, the threaded fastener may removably secure the outer sleeve to the adapter block. A first end of the biasing member may effect a biasing force on an inboard portion of the inner rod, and a second end of the biasing member may effect an opposing biasing force on the threaded fastener.

In at least one approach, the component delivery device may include an actuator that may axially displace a rod assembly. The rod assembly may include an outer sleeve and an inner rod that extends within the outer sleeve. The component delivery device may further include a sleeve extension that may be removably securable to the outer sleeve at an outboard end of the outer sleeve. The component delivery device may further include a removable tip that may be removably securable to the inner rod at an outboard end of the inner rod. For example, the removable tip may be threadedly secured to the inner rod. In a retracted configuration, at least a portion of the removable tip may extend longitudinally beyond an outboard end of the sleeve extension. In an ejection configuration, the sleeve extension may be disposed over the portion of the removable tip.

The outer sleeve may include a threaded sleeve interface at the outboard end of the outer sleeve. The threaded sleeve interface may be, for example, a threaded sleeve receptacle that extends into the outer sleeve. The sleeve extension may include a threaded extension interface at an inboard end of the sleeve extension. The threaded extension interface may be, for example, a threaded extension receptacle that extends into the sleeve extension. The component delivery device may further include a threaded adapter plug that extends into the threaded sleeve receptacle and the threaded extension receptacle. In this way, the threaded adapter plug may removably secure the sleeve extension to the outer sleeve.

The removable tip may include a cylindrical body and a plurality of annularly spaced tip extensions extending from the cylindrical body. The tip extensions may include four quadrant tip extensions. Each of the four quadrant tip extensions may be spaced apart from an adjacent quadrant tip extension.

The removable tip may include a cylindrical body having a first diameter, a neck portion extending from the cylindrical body and having a second diameter less than the first diameter, and a head portion extending from the neck portion and having a third diameter greater than the first diameter.

BRIEF DESCRIPTION OF THE DRAWINGS

FIG. 5A is an enlarged view of an outboard portion of the component delivery device as shown in FIG. 5.

FIG. 6 is a cross-sectional view of the component delivery device with the rod assembly in an ejection configuration.

FIG. 6A is an enlarged view of an outboard portion of the component delivery device as shown in FIG. 6.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

A component delivery device, as described herein, may be adapted to transport and eject or deposit a component at a desired location. The delivery device may be used, for example, in an industrial or manufacturing setting and may assist in the manufacture of a workpiece. As will be appreciated, the delivery device may be an automated tool that may autonomously transfer the components to a workpiece with minimal or no human intervention. In this way, the components may be directed from a source to the workpiece in a consistent, repeatable manner. By way of example, such components may include fasteners, such nuts, bolts, and weld studs. Components may also, or may instead, include assemblies or subassemblies of one or more components.

As will be appreciated, the component delivery device may be movable between various configurations during operation. For example, the component delivery device may move a rod assembly from a retracted configuration toward an extended configuration, and may further move the rod assembly from the extended configuration toward an ejection configuration. During movement of the rod assembly from the retracted configuration to the extended configuration, an outer sleeve and an inner rod may be moved together. During such movement, the rod assembly receives and displaces a fastening component; for example, from a feed head. During movement of the rod assembly from the extended configuration to the ejection configuration, further movement of the inner rod may be inhibited and the outer sleeve may be moved relative to the inner rod. During such movement, the rod assembly ejects the fastening component at the desired location; for example, at a workpiece.

Figure 1:
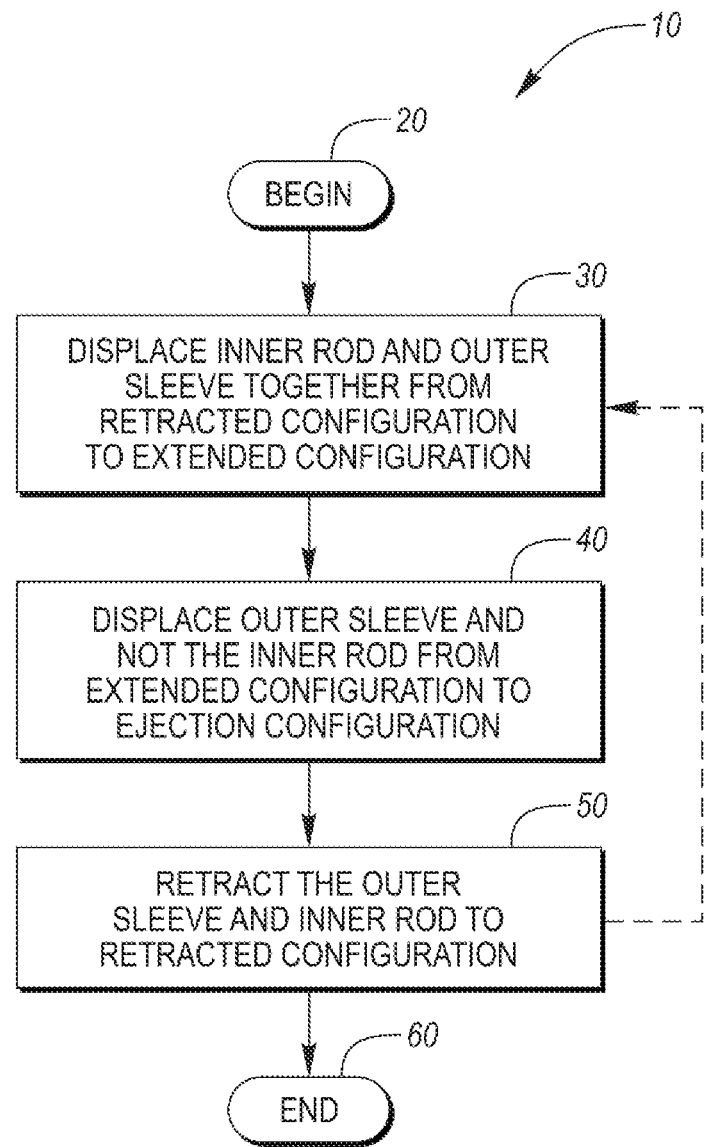
FIG. 1 is a flowchart of one method of operating a component delivery device.

Referring now to FIG. 1, a method 10 of operating a component delivery device is provided. The component delivery device may include an actuator that may drive a rod assembly. In at least one approach, the rod assembly includes an outer sleeve and an inner rod positioned within the outer sleeve. A biasing member, such as a spring, may be disposed within the outer sleeve and in engagement with the inner rod. As will be appreciated, the spring may be adapted to longitudinally bias the inner rod relative to the outer sleeve.

The rod assembly may further include an outboard end assembly including one or more removable parts. For example, the outboard end assembly may include a removable tip that may be removably secured to the inner rod. The outboard end assembly may further include a removable sleeve extension that may be removably secured to the outer sleeve. The removable tip and sleeve extension may be secured to the inner rod and outer sleeves, respectively, such that the sleeve extension extends over at least a portion of the removable tip.

As used herein, "inboard" refers to portions, regions, or locations that are relatively closer to the actuator (and, during operation, relatively farther from a workpiece), and "outboard" refers to portions, region, or locations that are relatively farther from the actuator than (and typically opposite) the inboard portions, regions, or locations described herein.

Assembly of the removable parts may be performed while the rod assembly is disposed in an extended configuration. Once assembled, due at least in part to a biasing force from the spring acting on the inner rod, at least a portion of the removable tip extends longitudinally beyond an outboard end of the removable sleeve extension. The extended removable tip portion may receive and support an ejectable component, as will be appreciated.

One method 10 of operating the component delivery device may begin at step 20, while the rod assembly is in a retracted configuration. At step 30, the actuator displaces the outer sleeve and inner rod together from the retracted configuration to the extended configuration. During the displacement, an outboard portion of the rod assembly may engage an ejectable component. For example, the outboard portion of the rod assembly may be driven (e.g., by the actuator) through a feed head that houses the ejectable components. The feed head may maintain the ejectable components in a predetermined loading position for engagement with the rod assembly. As the rod assembly is driven through the feed head, the outboard portion of the rod assembly drives the ejectable component out of the feed head and in the direction of the workpiece.

Displacement of the inner rod together with the outer sleeve may continue until the rod assembly achieves the extended configuration. As will be appreciated, the component delivery device may include a stop assembly that inhibits the inner rod from further axial movement toward the workpiece upon reaching the extended configuration.

At step 40, the actuator may displace the outer sleeve (e.g., axially toward the workpiece) to an ejection configuration. As discussed, further axial movement of the inner rod is inhibited in this configuration. As the outer sleeve is driven relative to the inner rod, the spring compresses. Axial movement of the outer sleeve relative to the inner rod further causes the outer sleeve to eject the ejectable component from the rod assembly, and more particularly, from the support surface of the removable tip. As such, in the ejection configuration, the removable sleeve extension extends over the portion of the removable tip previously exposed to receive the component.

At step 50, the actuator may cause the outer sleeve and inner rod to retract to the retracted configuration. More particularly, the actuator pulls the outer sleeve in an opposite axial direction. During the transition of the rod assembly from the ejection configuration to the retracted configuration, the spring biases the inner rod Upon sufficient retraction of the outer sleeve and inner rod, a subsequent ejectable component may be loaded (e.g., due at least in part to a gravitational force acting on the component) into the loading position for subsequent engagement with the rod assembly. The method 10 may end at step 60, or may be repeated a desired number of times.

Figure 2:
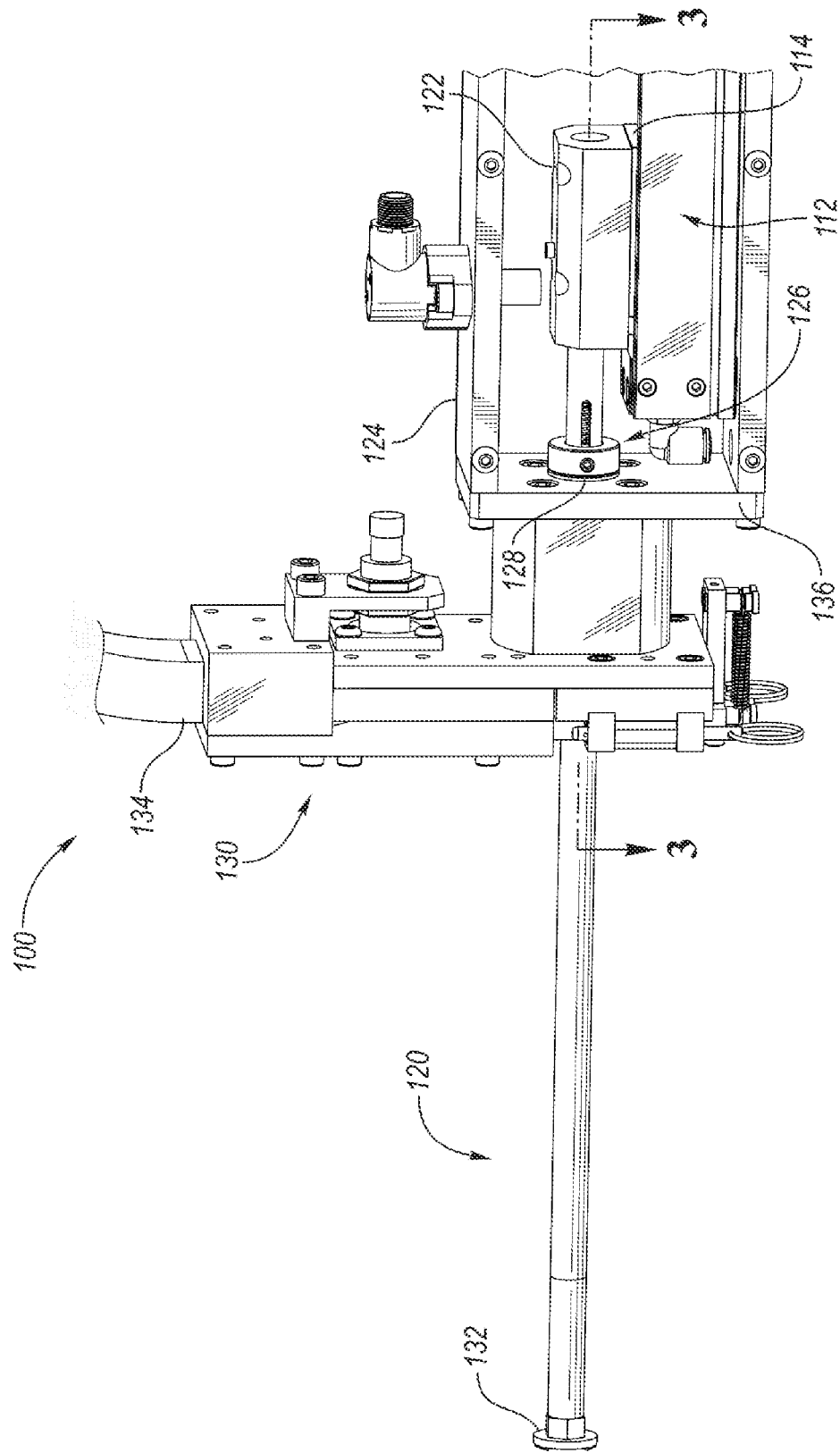
FIG. 2 is a perspective view of a component delivery device with a rod assembly in an extended configuration.

Referring to FIG. 2, a component delivery device, referred to herein as a delivery device 100, is shown in an extended configuration. As discussed, the delivery device 100 may be adapted to receive, transport, and eject or deposit a component at a desired location.

The delivery device 100 may include an electric (e.g., servo) actuator and/or a modified air cylinder. For example, the delivery device 100 may include an actuator 112. In at least one approach, the actuator 112 may be, or may include, a rodless actuator. The rodless actuator may be, for example, a magnetically coupled rodless cylinder. In this way, the actuator 112 may include a slidable member 114, which may be referred to as a traveler. In another exemplary approach, the rodless actuator may be a single- or double-acting pneumatic cylinder. Other suitable actuators are expressly contemplated.

The actuator 112 may be adapted to displace a rod assembly 120. In at least one approach, the actuator 112 may drive one or more components of the rod assembly 120 through an intermediary component such as an adapter block 122. In this way, the adapter block 122 may be secured to both a component of the actuator 112 (such as the slidable member 114) and a component of the rod assembly 120.

In at least one approach, one or more components of the delivery device 100 may be disposed within a housing 124. For example, at least a portion of the actuator 112 (e.g., at least a portion of the slidable member 114), the adapter block 122, an inboard portion of the rod assembly 120, and a pin stop 126 secured to the rod assembly 120 may be disposed within a cavity defined by the housing 124.

A rod guide or rod stop 128 may be disposed at a sidewall of the housing 124. The sidewall may be an outboard sidewall 136 of the housing 124. In at least one approach, the rod stop 128 may extend through an aperture of the sidewall of the housing 124, and may extend partially into the cavity defined by the housing 124. The rod stop 128 may include a through-hole extending therethrough for receiving the rod assembly 120. In this way, the rod stop 128 may guide the rod assembly 120 as the rod assembly 120 is moved relative to the housing 124. The rod stop 128 may also define an abutment surface, such as abutment surface 280 shown in FIG. 4. As discussed in greater detail elsewhere herein, the abutment surface may be selectively engaged by the pin stop 126. In still another approach, the rod stop 128 may be integrally formed with the housing, or formed as part of the housing, such that the pin stop 126 may selectively engage the sidewall of the housing 124.

The actuator 112 may be adapted to displace the rod assembly 120 through a feed head 130. The feed head 130 maybe adapted to receive and maintain components 132 in a predetermined location and orientation within the feed head 130. The components 132 may be, for example, bolts, studs, or nuts. In at least one approach, the components 132 may be weld nuts that may have a cylindrical body extending from a base flange. The weld nuts may be oriented within the feed head 130 such that the base flanges are substantially coplanar in a vertical plane, and a central axis of the cylindrical body extends orthogonally relative to the vertical plane. The weld nuts may be disposed such that when a first weld nut is removed from the feed head (e.g., by the rod assembly 120, as discussed in greater detail elsewhere herein), a second weld nut disposed vertically above the first weld nut drops into the location previously occupied by the first weld nut.

A chute 134 may be provided to deliver the components 132 to the feed head 130. The chute 134 may deliver the components 132 from a component source such as a hopper. In still another approach, a part feeder such as an overhead hopper or elevator hopper may be provided to deliver components 132 to the feed head 130.

Figure 3:
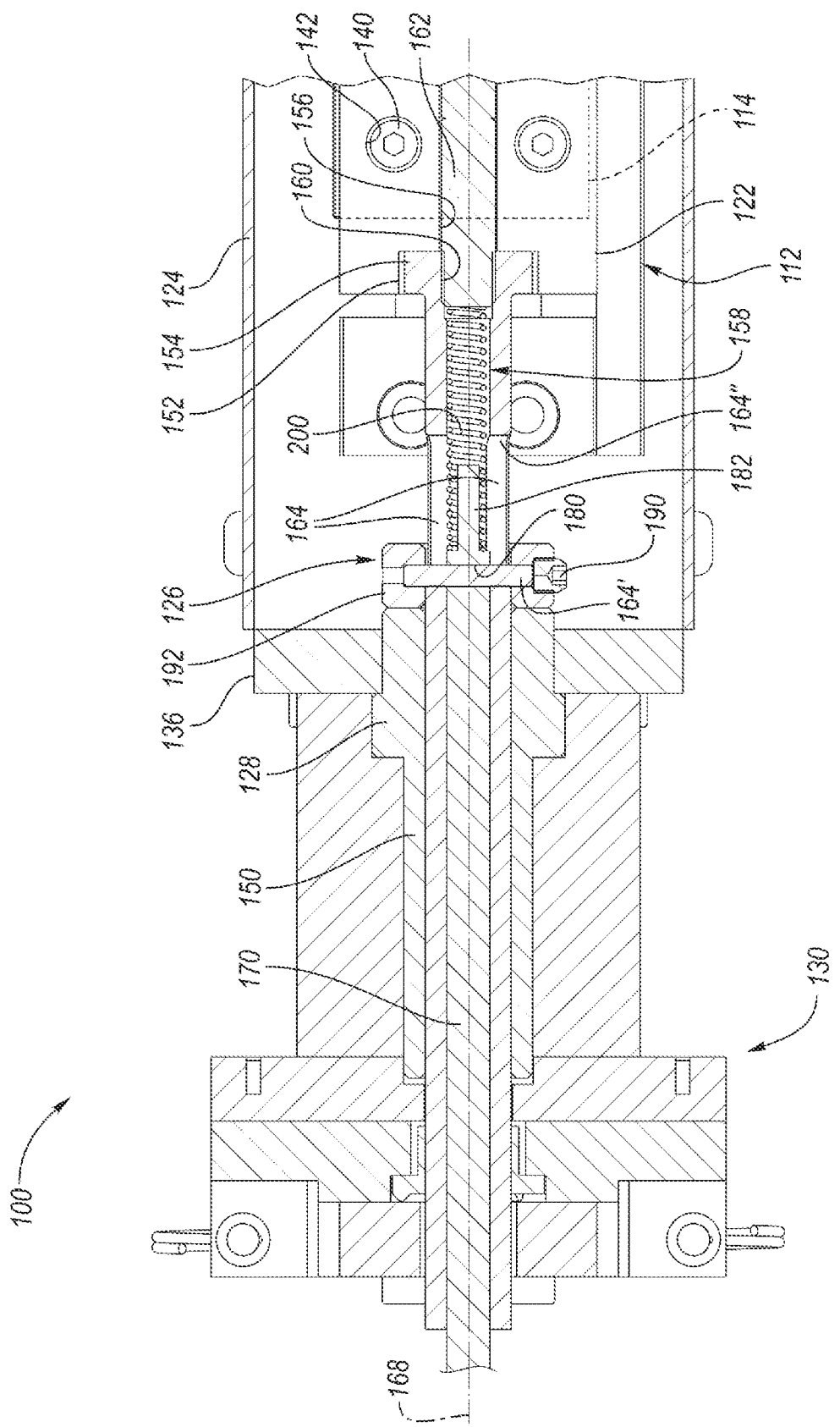
FIG. 3 is a partial cross-sectional view of the component delivery device taken along the line 3-3 of FIG. 2.

Referring now to FIG. 3, the adapter block 122 may be secured to the actuator 112; for example, to the slidable member 114 of the actuator 112. In at least one approach, a plurality of fasteners 140 (e.g., threaded fasteners) may extend through holes 142 of the adapter block 122 to secure the adapter block 122 to the slidable member 114. In this way, movement of the slidable member 114 in a longitudinal direction effects a corresponding movement of the adapter block 122.

The rod assembly 120 may be secured to the adapter block 122. For example, an outer sleeve 150 of the rod assembly 120 may be secured to the adapter block 122. In at least one approach, the adapter block 122 may include a boss recess 152 for receiving a boss 154 disposed at an inboard portion of the outer sleeve 150.

The boss 154 may have an outer diameter larger than an outer diameter of a body portion of the outer sleeve 150. For example, the elongated body portion of the outer sleeve 150 may have an outer diameter of approximately 0.5 inches, and the boss may have an outer diameter of approximately 0.75 inches.

A through-hole 156 may extend from the boss recess 152 and through the adapter block 122. The boss 154 may include a threaded receptacle 160 that may be axially aligned with the through-hole 156. A fastener 162, which may be at least partially threaded, may extend through the through-hole 156 and into the threaded receptacle 160 to secure the outer sleeve 150 to the adapter block 122. In this way, movement effected by the actuator 112 (e.g., through the slidable member 114) may effect a corresponding movement of the adapter block 122, which may in turn effect a corresponding movement of the outer sleeve 150.

As discussed, the rod assembly 120 may include an outer sleeve 150. The outer sleeve 150 may be a substantially tubular outer sleeve that defines an inner cavity 158. The inner cavity 158 may have a diameter, for example, of approximately 0.251 inches. The outer sleeve 150 may also include one or more guide slots 164 that may be disposed at an inboard portion of the outer sleeve 150. For example, the outer sleeve 150 may include a pair of opposing guide slots 164. The guide slots 164 may extend radially through the tubular wall of the outer sleeve 150; for example, from an outer surface of the outer sleeve 150 to the inner cavity 158. The guide slots 164 may also extend longitudinally parallel to a central axis 168 of the rod assembly 120. In this way, the guide slots 164 may be referred to as elongated guide slots. The elongated guide slots may have a longitudinal length, for example, of approximately 1.17 inches.

Although a pair of opposing elongated slots are depicted and described, it is expressly contemplated that the outer sleeve may be provided with a single elongated slot, or three, four, or more elongated slots.

The rod assembly 120 may further include an inner rod 170. The inner rod 170 may be at least partially disposed within the outer sleeve 150; for example, within the inner cavity 158. The inner rod 170 may have an outer dimension that is less than the diameter of the inner cavity 158 of the outer sleeve 150; for example, approximately 0.25 inches. In this way, the inner rod 170 may be movably received within the outer sleeve 150. As will be appreciated, the outer sleeve 150 may be moved (e.g., due to movement of the actuator 112) together with the inner rod 170 axially in a longitudinal direction, and may further be moved axially in the longitudinal direction when axial movement of the inner rod 170 in the longitudinal direction is inhibited.

The inner rod 170 may include a pin guide 180. The pin guide 180 may be disposed at an inboard portion of the inner rod 170, and may be a through-hole that may extend through an entire diameter of the inner rod 170. The pin guide 180 may have a diameter, for example, of approximately 0.125 inches. The inner rod 170 may be disposed within the outer sleeve 150 such that the pin guide 180 is disposed at least partially in alignment with one or both of the guide slots 164.

The inner rod 170 may further include a spring guide 182. The spring guide 182 may be a cylindrical spring guide that may extend from an inboard portion of the inner rod 170. The spring guide 182 may have a reduced dimension relative to the body portion of the inner rod 170. For example, the spring guide 182 may have a diameter (e.g., 0.125 inches) that may be approximately half the outer diameter of the inner rod 170. In one example approach, the spring guide 182 has a diameter of approximately 0.125 inches. In this way, a biasing member such as a spring may be provided about the spring guide 182 within the inner cavity 158 of the outer sleeve 150, as discussed in greater detail elsewhere herein. The spring guide 182 may include a chamfer at an inboard portion of the spring guide 182 that may aid in installation of the spring.

As discussed, the delivery device 100 may include a pin stop 126. The pin stop 126 may be adapted to inhibit axially movement of the inner rod 170 relative to the outer sleeve 150 during a portion of the stroke of the rod assembly 120. In at least one approach, the pin stop 126 is an assembly that includes a pin 190 and an annular stop 192. The annular stop 192 may extend about the rod assembly 120, and may be slidable along an outer circumference of the outer sleeve 150. The pin 190 may extend through a first portion of the annular stop 192, a first elongated slot 164 of the outer sleeve, the pin guide 180 of the inner rod 170, a second elongated slot 164, and into a second, opposing portion of the annular stop 192. The pin 190 may cooperate with the pin guide 180 and the annular stop 192 to movably fix the annular stop 192 relative to the inner rod 170. The pin 190 may further cooperate with the elongated slots 164 to permit movement of the outer sleeve 150 relative to the annular stop 192. Movement of the outer sleeve 150 relative to the annular stop 192 may be in the longitudinal direction, and the stroke length of the outer sleeve 150 relative to the annular stop 192 (and thereby, the inner rod 170) may correspond to the axial length of the elongated slots 164.

The delivery device 100 may further include a biasing member. In at least one approach, the biasing member is a spring 200. Other the biasing members are expressly contemplated. The biasing member may be a resilient, rigid, semi-rigid, flexible, or elastic member, component, element, and the like. The resilient nature of the biasing member may help avoid permanent deformation while under load. Moreover, the biasing member may facilitate constant contact between various components of the delivery device 100.

The spring 200 may be disposed within the outer sleeve 150; for example, in the inner cavity 158 at an inboard portion of the outer sleeve 150. The spring 200 may be positioned such that an outboard first end of the spring 200 engages (e.g., directly or indirectly) an inboard surface of the inner rod 170. In this way, the spring 200 may be disposed about the spring guide 182 of the inner rod 170. An inboard second end of the spring 200 that is opposite the first end may be disposed in engagement (e.g., directly or indirectly) with the fastener 162 when the fastener 162 is secured to the outer sleeve 150. In still another approach, the inboard second end of the spring 200 may be disposed in engagement with a portion of the outer sleeve 150. In still other approaches, the inboard second end of the spring 200 may be disposed in engagement with a portion of the adapter block 122, a portion of the actuator 112, or other surface or combination of surfaces of the delivery device 100.

The spring 200 may be an open-coil helical spring. The spring 200 may be a compression spring that offers resistance to a compressive force applied axially. More particularly, the spring 200 may act to bias the inner rod 170 away from the fastener 162. In this way, inner rod 170 may be urged such that the pin 190 of the pin stop 126 is disposed at the outboard regions of the elongated slots 164 of the outer sleeve 150. As will be appreciated, compression of the spring 200 due to axial movement of the outer sleeve 150 relative to the inner rod 170 may cause the pin 190 to slide axially to inboard regions of the elongated slots 164.

Figure 4:
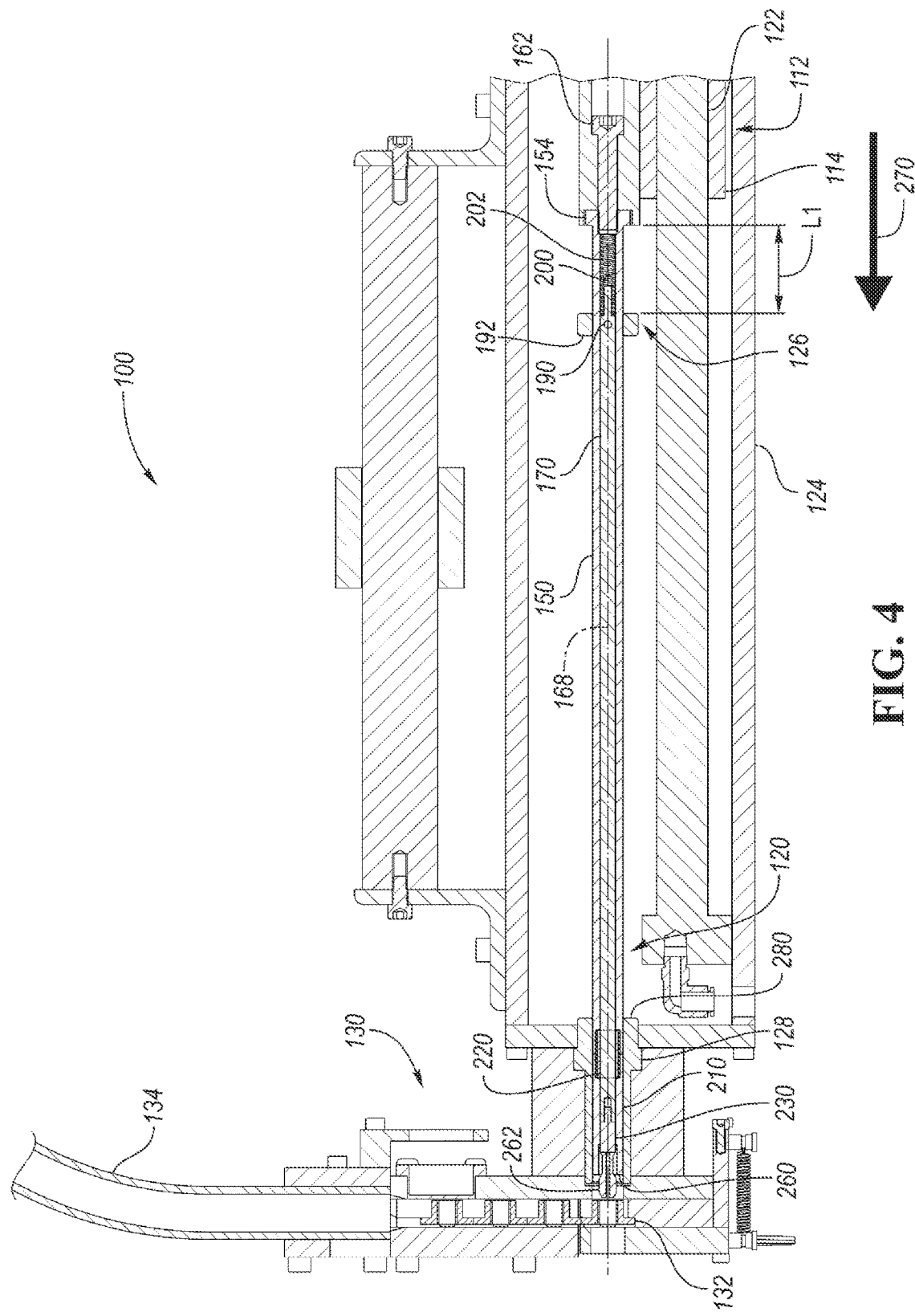
FIG. 4 is a cross-sectional view of the component delivery device with the rod assembly in a retracted configuration.
Figure 5:
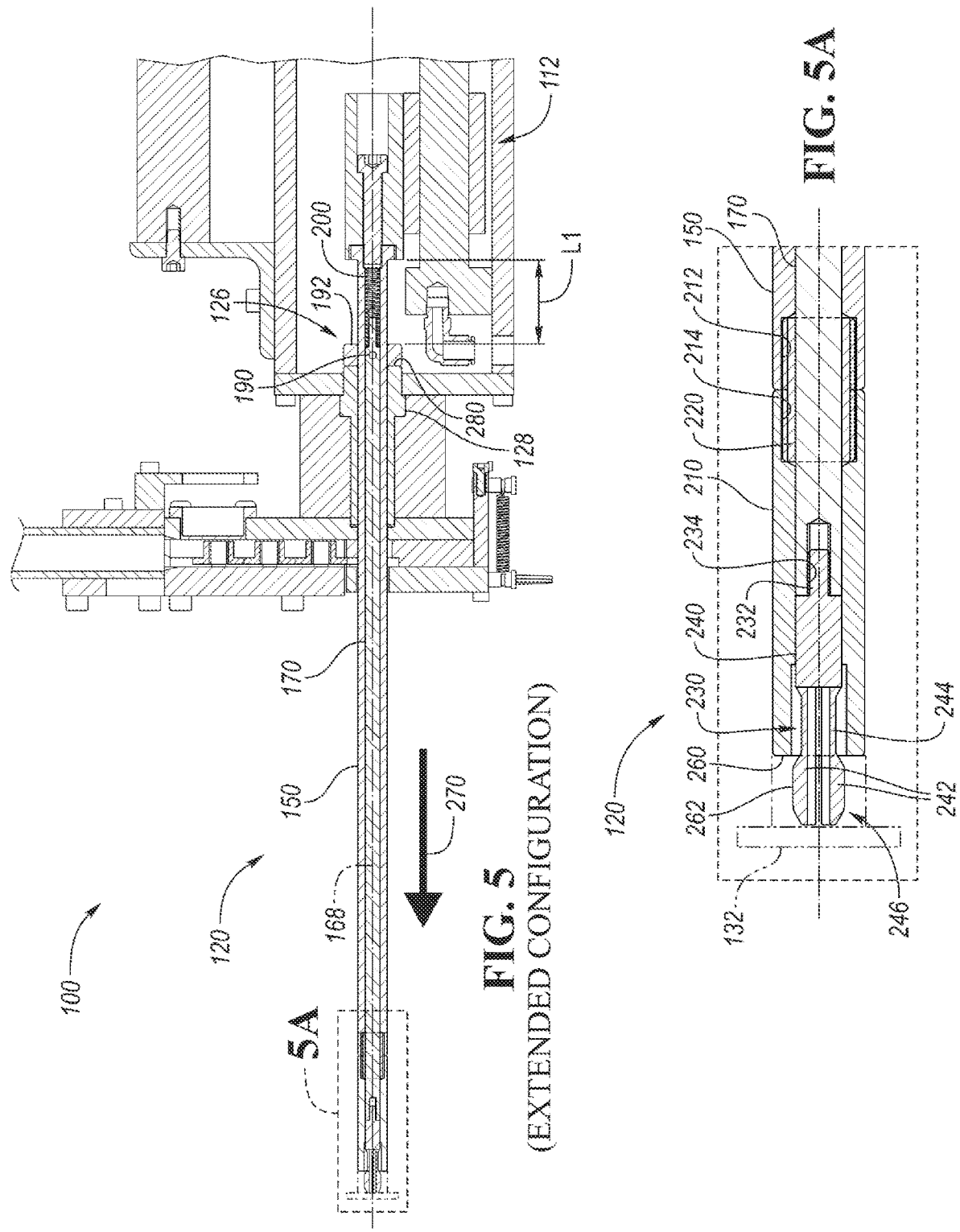
FIG. 5 is a cross-sectional view of the component delivery device with the rod assembly in the extended configuration.

As discussed, the delivery device 100 may be movable from a retracted configuration, shown in FIG. 4, toward an extended configuration, shown in FIG. 5. The delivery device 100 may further be movable from the extended configuration, to an ejection configuration. As the delivery device 100 moves from the extended configuration toward the ejection configuration, an outboard portion of the rod assembly 120 may be moved to eject a component.

Referring to FIG. 5A, the outboard portion of the rod assembly 120 will now be described. A sleeve extension 210 may be removably secured to the outer sleeve 150; for example, at an outboard end of the outer sleeve 150. The sleeve extension 210 may be formed of, or include, a non-magnetic material. For example, the sleeve extension 210 may be formed of austenitic stainless steel.

In at least one approach, the outer sleeve 150 may include a threaded sleeve interface 212 at the outboard end of the outer sleeve 150. The threaded sleeve interface 212 may be a threaded sleeve receptacle that extends into the outer sleeve 150. The sleeve extension 210 may include a threaded extension interface 214 at an inboard end of the sleeve extension 210. The threaded extension interface 214 may be a threaded extension receptacle that extends into the sleeve extension 210. In at least one approach, the rod assembly 120 includes a threaded adapter plug 220. An inboard portion of the threaded adapter plug 220 may extend into the threaded sleeve receptacle, and an outboard portion of the threaded adapter plug 220 may extend into the threaded extension receptacle. In this way, the threaded adapter plug 220 may secure the sleeve extension 210 to the outer sleeve 150.

In still another approach, the threaded sleeve interface 212 may be a threaded protrusion, and the threaded extension interface 214 may be a threaded receptacle that receives the threaded protrusion. In still another approach, the threaded extension interface 214 may be a threaded protrusion, and the threaded sleeve interface 212 may be a threaded receptacle that receives the threaded protrusion. In such approaches, the sleeve extension 210 may be directly secured to the outer sleeve 150 such that an adapter plug may be omitted. Other approaches for securing the sleeve extension 210 to the outer sleeve 150 are expressly contemplated. For example, it is expressly contemplated that one component (e.g., the outer sleeve 150 or the sleeve extension 210) may include a male interface, while the other component (e.g., the other of the outer sleeve 150 and the sleeve extension 210) may include a female interface that interfaces with the male interface.

The rod assembly 120 may further include a removable tip 230. The removable tip 230 may be removably secured to the inner rod 170; for example, at an outboard end of the inner rod 170. In at least one approach, the removable tip 230 may be threadedly secured to the inner rod 170. For example, a threaded protrusion 232 of the removable tip 230 may be threadedly secured to a threaded recess 234 located at the outboard portion of the inner rod 170. In still another approach, the removable tip 230 may be provided with a threaded recess, and the inner rod 170 may include a threaded protrusion adapted to interface with the threaded recess for securing the removable tip 230 to the inner rod 170. Other approaches for securing the removable tip 230 to the inner rod 170 are expressly contemplated.

In at least one approach, the removable tip 230 may include a cylindrical body 240. The threaded protrusion 232 may extend from an inboard surface of the cylindrical body 240. One or more tip extensions 242 may extend from the cylindrical body 240; for example, from an outboard portion of the cylindrical body 240. In at least one approach, the tip extensions 242 are a plurality of annularly spaced tip extensions. For example, the removable tip 230 may include four annularly spaced tip extensions 242. In this way, each individual tip extension 242 may define a quadrant tip extension. Each of the four quadrant tip extension may be spaced apart from an adjacent quadrant tip extension. In still another approach, the removable tip 230 may include a single extension, two extensions, three extensions, five extensions, or six or more extensions. The extensions may be regularly spaced annularly about a central axis, or may be irregularly spaced about the central axis. Individual extensions may define a common geometry as compared to an adjacent extension. In still another approach, the extensions may define different geometries.

The removable tip 230, and more particularly may further define a neck portion 244 that extends from the cylindrical body 240, and may further a head portion 246 that extends from the neck portion 244. In the approach shown, the tip extensions 242 define the neck portion 244 and the head portion 246. The head portion 246 may define a support surface for receiving and supporting an ejectable component 132, as discussed in greater detail elsewhere herein.

In at least one approach, the removable tip 230 is a variable diameter tip. For example, the cylindrical body 240 may have a first diameter, the neck portion 244 may have a second diameter less than the first diameter, and the head portion 246 may have a third diameter greater than the first and second diameters. By way of example, the cylindrical body 240 may have an outer diameter of approximately 0.25 inches. A first chamfer region may extend from the cylindrical body 240 to the neck portion 244, which may have an outer diameter of approximately 0.188 inches. A second chamfer region may extend from the neck portion 244 to the head portion 246, which may have an outer diameter of approximately 0.282 inches. The threaded protrusion 232 of the removable tip 230 may have an outer diameter less than the diameters of the cylindrical body 240, the neck portion 244 and the head portion 246, and may be, for example, approximately 0.125 inches.

The various components described herein may cooperate to assist in receiving, transporting, and ejecting an ejectable component 132. In this regard, various components may be moved between various axial positions and configurations. As described in more detail with reference to FIGS. 4-6, the delivery device 100 may be moved between a retracted configuration (e.g., as shown in FIG. 4), an extended configuration (e.g., as shown in FIGS. 5 and 5A), and an ejection configuration (e.g., as shown in FIGS. 6 and 6A).

Referring now to FIG. 4, the delivery device 100 may be disposed in a retracted configuration. In the retracted configuration, a majority of the rod assembly 120 may be located within the housing 124. As discussed, the spring 200 extends from the fastener 162 to the inner rod 170 to bias the inner rod 170 relative to the outer sleeve 150. In this way, the spring 200 may be configured to bias the inner rod 170 in an outward axial direction, indicated by arrow 270, relative to the outer sleeve 150. In the retracted configuration, the pin 190 may be urged to the forward-most (e.g., outboard) axial position within the guide slots 164 of the outer sleeve 150. Referring again momentarily to FIG. 3, in the retracted configuration, the pin 190 may be urged to a first longitudinal location 164' of the guide slots 164. As such, the spring 200 may have an axial length L1.

In the retracted configuration, at least a portion of the removable tip 230 may extend axially beyond an outward-facing surface 260 of the sleeve extension 210. For example, a support surface 262 of the removable tip 230 may extend axially beyond the outward-facing surface 260 of the sleeve extension 210. The support surface 262 may be, or may include, an upper surface of the removable tip 230 such that ejectable components may be gravitationally supported on the support surface 262. The support surface 262 may extend in a longitudinal direction that may be substantially parallel (e.g., within 15 degrees) to a central axis 168 of the rod assembly 120, and the outward-facing surface 260 of the sleeve extension 210 may extend substantially orthogonal (e.g., within 15 degrees) to the central axis of the rod assembly 120. In at least one approach, in the retracted configuration, the neck portion 244 of the removable tip 230 may be disposed within the sleeve extension 210, and at least a portion of the head portion 246 may extend axially beyond the outward-facing surface 260 of the sleeve extension 210. In this way, the head portion 246 may define at least a portion of the support surface 262.

Also in the retracted configuration, the outboard end of the rod assembly 120, and more particularly, the support surface 262 of the removable tip 230 and the outward-facing surface 260 of the sleeve extension 210, may be disposed at an inboard side of an ejectable component 132 loaded in the feed head 130.

During the stroke from the retracted configuration of FIG. 4 and the extended configuration of FIG. 5, the actuator 112 may drive the rod assembly 120 toward the ejectable component 132 such that the rod assembly 120 engages the ejectable component 132. More particularly, the actuator 112 may be adapted to drive the outer sleeve 150 (e.g., through the adapter block 122 and the fastener 162) in an axial direction 270, toward the ejectable component 132.

The actuator 112 may drive the rod assembly 120 into engagement with the ejectable component 132 such that one or both of the support surface 262 of the removable tip 230 and the outward-facing surface 260 of the sleeve extension 210 drive the ejectable component 132 from the feed head 130. Continued movement of the rod assembly 120 in the axial direction 270 drives the ejectable component 132 out of the feed head 130.

As the outer sleeve 150 is driven in the axial direction 270, the fastener 162 correspondingly drives the spring 200 in the axial direction 270. The spring 200 may have a sufficient stiffness such that the spring 200 correspondingly drives the inner rod 170 and connected removable tip 230. That is, the axial length L1 of the spring remains substantially constant (or slightly compressed) and the pin 190 may be maintained in the forward-most position within the guide slots 164 during the stroke of the rod assembly 120 from the retracted configuration and the extended configuration. As such, from the retracted configuration, the actuator 112 may drive the outer sleeve 150 together with the inner rod 170.

During the stroke from the retracted configuration to the extended configuration, the outer sleeve 150 and inner rod 170 may pass through the rod stop 128. Also during the stroke, the annular stop 192 of the pin stop 126 may be urged toward an abutment surface 280 of the rod stop 128.

Referring now to FIGS. 5 and 5A, the actuator 112 may drive the rod assembly 120 to an extended configuration. In the extended configuration, the annular stop 192 engages the abutment surface 280 of the rod stop 128. As such, further axial movement of the inner rod 170 in the axial direction 270 is inhibited by the engagement of the annular stop 192 with the abutment surface 280.

In the extended configuration, the ejectable component is maintained on the rod assembly 120; for example, on the support surface 262 of the head portion 246 of the removable tip 230.

Referring now to FIGS. 6 and 6A, the actuator 112 may drive the rod assembly 120 from the extended configuration to an ejection configuration. During the stroke from the extended configuration to the ejection configuration, axial movement of the inner rod 170 in the longitudinal direction is substantially inhibited due to the engagement of the annular stop 192 and the rod stop 128. The outer sleeve 150, however, continues to move over the inner rod 170 in the longitudinal direction. As the outer sleeve 150 moves, the guide slots 164 are driven across the pin 190.

At the outboard portion of the rod assembly 120, the sleeve extension 210 may be driven (e.g., by the outer sleeve 150) over the removable tip 230. More particularly, the outward-facing surface 260 of the sleeve extension 210 is driven axially over the support surface 262 of the removable tip 230 to drive the ejectable component 132 off of the rod assembly 120. In at least one approach, the ejectable component 132 is ejected to a predetermined or desired location; for example, at a selected location on a workpiece. In this way, the ejectable components 132 may delivered to the workpiece(s) in a consistent, repeatable manner.

In the ejection configuration, the outer sleeve 150 is longitudinally displaced relative to the inner rod 170, and the spring 200 is compressed to a second longitudinal length L2 that is less than the first longitudinal length L1. Also in the ejection configuration, the pin 190 may be disposed at a second longitudinal location (e.g., location 164" of FIG. 3) along the elongated guide slots 164 that is longitudinally offset from the first longitudinal location. In this way, the difference in longitudinal lengths L1 and L2 may generally correspond to an axial length of the guide slots 164. Also in the ejection configuration, the sleeve extension 210 extends over a previously-exposed portion of the removable tip 230 (e.g., support surface 262).

After ejection of the ejectable component 132, the actuator 112 may be adapted to drive the outer sleeve 150 in a second axial direction 272 opposite the first axial direction 270. During the stroke from the ejection configuration to the extended configuration, the outer sleeve 150 may be axially displaced, while the spring 200 may continue to bias the pin stop 126 against the abutment surface 280 such that the inner rod 170 is not axially displaced. Upon sufficient displacement of the outer sleeve 150 in the second axial direction 272, the first longitudinal location of the guide slots 164 engages the pin 190 such that continued axial movement of the outer sleeve 150 in the second axial direction 272 drives the inner rod 170 in the second axial direction 272. The actuator 112 may continue to drive the rod assembly 120 in the second axial direction 272 until the delivery device 100 is returned to the retracted configuration. As discussed, upon resetting of the delivery device 100 to the retracted configuration, a subsequent ejectable component 132 may drop or be biased into a loading position within the feed head 130. The process may be repeated as desired.

While exemplary embodiments are described above, it is not intended that these embodiments describe all possible forms encompassed by the claims. The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

LISTING OF COMPONENTS

100: delivery device
112: actuator
114: slidable member
120: rod assembly
122: adapter block
124: housing
126: pin stop
128: rod stop
130: feed head
132: ejectable component
134: chute
136: outboard sidewall 140: fastener
142: hole
150: outer sleeve
152: boss recess
154: boss
156: through-hole
158: inner cavity
160: receptacle
162: fastener
164: guide slot
164': first longitudinal location of guide slot
164": second longitudinal location of guide slot
168: central axis
170: inner rod
180: pin guide
182: spring guide
190: pin
192: annular stop
200: spring
210: sleeve extension
212: sleeve interface
214: extension interface
220: adapter plug
230: removable tip
232: protrusion
234: recess
240: cylindrical body
242: tip extension
244: neck portion
246: head portion
260: outward-facing surface
262: support surface
270: first axial direction
272: second axial direction
280: abutment surface

What is claimed is:

1. A method of operating a component delivery device comprising:
with an actuator,
displacing an outer sleeve and an inner rod positioned within a cavity of the outer sleeve together from a retracted configuration toward an extended configuration to move an ejectable component in relation to a feed head; and
displacing the outer sleeve and not the inner rod to an ejection configuration to displace the ejectable component toward a workpiece, wherein displacing the outer sleeve and not the inner rod translates the outer sleeve over the inner rod and compresses a biasing member that is disposed at least partially within the cavity and in engagement with the inner rod.

2. The method of claim 1 further comprising:
securing a removable tip to an outboard end of the inner rod, the removable tip including a support surface for receiving the ejectable component.

3. The method of claim 2 further comprising:
securing a removable sleeve extension to an outboard end of the outer sleeve, wherein in the retracted configuration, at least a portion of the removable tip extends longitudinally beyond an outboard end of the removable sleeve extension to receive the ejectable component.

4. The method of claim 3 wherein in the ejection configuration, the removable sleeve extension is displaced over the portion of the removable tip to eject the ejectable component.

5. A component delivery device comprising:
a rod assembly including an outer sleeve and an inner rod extending at least partially within the outer sleeve;
a biasing member positioned at least partially within the outer sleeve and configured to effect a biasing force on the inner rod, the biasing member having a first axial length (L1) when the rod assembly is in a retracted configuration; and
an actuator configured to displace the outer sleeve and the inner rod together from the retracted configuration to an extended configuration to move an ejectable component with the rod assembly, the actuator being further configured to displace the outer sleeve from the extended configuration to an ejection configuration to eject the ejectable component from the rod assembly, wherein in the ejection configuration, the outer sleeve is axially displaced relative to the inner rod and the biasing member is compressed to a second axial length (L2) that is less than the first axial length (L1).

6. The component delivery device of claim 5 wherein the outer sleeve includes a guide slot extending longitudinally along the outer sleeve, and wherein the inner rod includes a pin guide disposed in alignment with at least a portion of the guide slot.

7. The component delivery device of claim 6 further comprising a pin stop including a pin that extends through the guide slot and the pin guide such that the pin is movably fixed to the inner rod and is displaceable within the guide slot.

8. The component delivery device of claim 7 wherein the pin stop includes an annular stop extending about an outer circumference of the outer sleeve, the annular stop being movably fixed to the inner rod and displaceable relative to the outer sleeve.

9. The component delivery device of claim 8 further comprising:
a rod stop including an abutment surface and defining an aperture for receiving the outer sleeve and the inner rod, wherein
in the retracted configuration, the annular stop is spaced apart from the rod stop and the pin is disposed at a first longitudinal location along the guide slot,
in the extended configuration, the annular stop is engaged with the rod stop, and
in the ejection configuration, the pin is disposed at a second longitudinal location along the guide slot longitudinally offset from the first longitudinal location.

10. The component delivery device of claim 5 further comprising:
an adapter block secured to a slidable member of the actuator and to an inboard portion of the outer sleeve.

11. The component delivery device of claim 10 wherein the inboard portion of the outer sleeve includes a threaded receptacle, wherein the adapter block includes a through-hole, and wherein a threaded fastener extends through the through-hole and into the threaded receptacle to removably secure the outer sleeve to the adapter block.

12. The component delivery device of claim 11 wherein a first end of the biasing member effects the biasing force on an inboard portion of the inner rod, and wherein a second end of the biasing member effects an opposing biasing force on the threaded fastener.

13. A component delivery device comprising:
an actuator for axially displacing a rod assembly that includes an outer sleeve and an inner rod that extends within the outer sleeve;

a sleeve extension removably securable to the outer sleeve at an outboard end of the outer sleeve; and a removable tip removably securable to the inner rod at an outboard end of the inner rod, wherein in a retracted configuration, at least a portion of the removable tip extends longitudinally beyond an outboard end of the sleeve extension, and in an ejection configuration, the sleeve extension is disposed over the portion of the removable tip.

14. The component delivery device of claim 13 wherein the outer sleeve includes a threaded sleeve interface at the outboard end of the outer sleeve, and wherein the sleeve extension includes a threaded extension interface at an inboard end of the sleeve extension.

15. The component delivery device of claim 14 wherein the threaded sleeve interface is a threaded sleeve receptacle that extends into the outer sleeve, and wherein the threaded extension interface is a threaded extension receptacle that extends into the sleeve extension.

16. The component delivery device of claim 15 further comprising:

a threaded adapter plug extending into the threaded sleeve receptacle and the threaded extension receptacle to removably secure the sleeve extension to the outer sleeve.

17. The component delivery device of claim 13 wherein the removable tip is threadedly secured to the inner rod.

18. The component delivery device of claim 13 wherein the removable tip includes a cylindrical body and a plurality of annularly spaced tip extensions extending from the cylindrical body.

19. The component delivery device of claim 18 wherein the tip extensions include four quadrant tip extensions, each of the four quadrant tip extensions being spaced apart from an adjacent quadrant tip extension.

20. The component delivery device of claim 13 wherein the removable tip includes a cylindrical body having a first diameter, a neck portion extending from the cylindrical body and having a second diameter less than the first diameter, and a head portion extending from the neck portion and having a third diameter greater than the first diameter.

* * * * *